(12) United States Patent
Ochiai

(10) Patent No.: US 11,246,242 B2
(45) Date of Patent: Feb. 8, 2022

(54) MODULE, AND SERVER

(71) Applicant: NEC Platforms, Ltd., Kawasaki (JP)

(72) Inventor: Syoji Ochiai, Kanagawa (JP)

(73) Assignee: NEC Platforms, Ltd., Kanagawa (JP)

(*) Notice: Subject to any disclaimer, the term of this patent is extended or adjusted under 35 U.S.C. 154(b) by 0 days.

(21) Appl. No.: 16/756,795

(22) PCT Filed: Jul. 24, 2018

(86) PCT No.: PCT/JP2018/027736
§ 371 (c)(1),
(2) Date: Apr. 16, 2020

(87) PCT Pub. No.: WO2019/077827
PCT Pub. Date: Apr. 25, 2019

(65) Prior Publication Data
US 2021/0195805 A1 Jun. 24, 2021

(30) Foreign Application Priority Data
Oct. 20, 2017 (JP) .............................. JP2017-203289

(51) Int. Cl.
*H05K 7/20* (2006.01)
(52) U.S. Cl.
CPC ................ *H05K 7/20781* (2013.01)
(58) Field of Classification Search
None
See application file for complete search history.

(56) References Cited

U.S. PATENT DOCUMENTS

| | | | |
|---|---|---|---|
| 7,212,409 B1* | 5/2007 | Belady | G06F 1/20 361/721 |
| 7,428,150 B1 | 9/2008 | Stefanoski et al. | |
| 7,539,020 B2* | 5/2009 | Chow | H05K 7/20727 165/104.21 |
| 8,437,129 B2* | 5/2013 | Tung | H05K 7/20781 361/679.47 |
| 8,760,855 B2* | 6/2014 | Howes | H05K 7/20936 361/677 |
| 10,212,849 B2* | 2/2019 | Matsumoto | H05K 7/20236 |
| 10,408,545 B2* | 9/2019 | Nakamura | F28D 15/0266 |

(Continued)

FOREIGN PATENT DOCUMENTS

| | | |
|---|---|---|
| CN | 205003610 U | 1/2016 |
| CN | 205427746 U | 8/2016 |

(Continued)

OTHER PUBLICATIONS

International Search Report for PCT/JP2018/027736 dated Oct. 16, 2018 [PCT/ISA/210].

(Continued)

*Primary Examiner* — Courtney L Smith
(74) *Attorney, Agent, or Firm* — Sughrue Mion, PLLC

(57) ABSTRACT

A module including a substrate; a cooling unit that cools a heat-generating component provided on the substrate; a connection terminal portion provided on the substrate; and a connection pipe that is connected to the cooling unit and that extends in a direction different from a direction of at least one of insertion and withdrawal of the connection terminal portion, wherein the connection pipe extends from a side towards the connection terminal portion.

6 Claims, 7 Drawing Sheets

(56) References Cited

U.S. PATENT DOCUMENTS

| | | | |
|---|---|---|---|
| 10,624,236 B2* | 4/2020 | Inano | H05K 7/20272 |
| 2005/0230083 A1 | 10/2005 | Hsieh | |
| 2006/0171117 A1* | 8/2006 | Hamman | G06F 1/206 |
| | | | 361/699 |
| 2009/0080151 A1* | 3/2009 | Kalms | G06F 1/20 |
| | | | 361/679.52 |
| 2015/0043165 A1* | 2/2015 | Best | G06F 1/20 |
| | | | 361/699 |
| 2017/0265328 A1* | 9/2017 | Sasaki | H05K 7/20781 |

FOREIGN PATENT DOCUMENTS

| | | |
|---|---|---|
| JP | 10-070386 A | 3/1998 |
| JP | 2000-330667 A | 11/2000 |
| JP | 2000-338173 A | 12/2000 |
| JP | 2001-111279 A | 4/2001 |
| JP | 2007-281430 A | 10/2007 |
| JP | 2013-140864 A | 7/2013 |
| JP | 2013-232505 A | 11/2013 |
| WO | 2011/040129 A1 | 4/2011 |

OTHER PUBLICATIONS

Written Opinion for PCT/JP2018/027736 dated Oct. 16, 2018 [PCT/ISA/237].
Decision of Refusal dated May 16, 2019.
Extended European Search Report for EP Application No. EP18869063.0 dated Jun. 9, 2021.

* cited by examiner

MODULE, AND SERVER

CROSS REFERENCE TO RELATED APPLICATIONS

This application is a National Stage of International Application No. PCT/JP2018/027736 filed Jul. 24, 2018, claiming priority based on Japanese Patent Application No. 2017-203289 filed Oct. 20, 2017.

TECHNICAL FIELD

The present invention relates to a module, and a server.

BACKGROUND ART

Patent Document 1 discloses a configuration provided with a cooling block for cooling electronic components on a printed circuit board. In this configuration, cooling pipes through which a refrigerant flows are connected to the cooling block. Additionally, the printed circuit board has a connector on one edge of the printed circuit board. The cooling pipes extend to the outside of the printed circuit board from an edge of the printed circuit board opposite to the edge on which the connector is provided. The connector insertion/withdrawal direction of the printed circuit board is aligned with the connection direction of the cooling pipe.

Patent Document 2 discloses a configuration provided with a cooling plate for cooling electronic components on a printed circuit board. In this configuration, the cooling plate is provided with a cooling channel through which a refrigerant flows. Additionally, the printed circuit board has a socket that can be inserted or withdrawn with respect to a connector. Hose nipples provided on the ends of the cooling channel are disposed on an edge of the printed circuit board on which the socket is provided. The insertion/withdrawal direction of the socket on the printed circuit board is aligned with the connection direction of the hose nipples.

CITATION LIST

Patent Literature

[Patent Document 1]
 Japanese Unexamined Patent Application, First Publication No 2000-338173
[Patent Document 2]
 Japanese Unexamined Patent Application, First Publication No H10-70386

SUMMARY OF INVENTION

Problem to be Solved by the Invention

There are cases in which the insertion/withdrawal direction of a printed circuit board is made different from the connection direction of cooling piping (cooling pipes, hose nipples). In such cases, when inserting or removing the printed circuit board, the cooling pipes extending from the printed circuit board can interfere with other components, making it difficult to insert and withdraw the printed circuit board.

Patent Documents 1 and 2 do not disclose configurations for cases in which the insertion/withdrawal direction of the printed circuit board is not aligned with the connection directions of the cooling pipes and the hose nipples. Therefore, Patent Documents 1 and 2 cannot solve the above-mentioned problem in which the cooling pipes interfere with other components when inserting and withdrawing a printed circuit board in the case wherein the insertion/withdrawal direction of the printed circuit board and the connection direction of the cooling pipes are not aligned.

The present invention was made in view of the above-mentioned problem, and provides a module and a server wherein, in the module, which is provided with a connection pipe extending in a direction different from the insertion/withdrawal direction of a connection terminal portion, a substrate can be easily inserted and withdrawn.

Means for Solving the Problem

A module according to one embodiment of the present invention includes a substrate; a cooling unit that cools a heat-generating component provided on the substrate; a connection terminal portion provided on the substrate; and a connection pipe that is connected to the cooling unit and that extends in a direction different from a direction of at least one of insertion and withdrawal of the connection terminal portion, wherein the connection pipe extends from a side towards the connection terminal portion.

A server according to one embodiment of the present invention includes a module as mentioned above; and a housing containing the module; wherein the housing has an opening portion that faces the edge of the substrate from which the connection pipe extends; and the connection pipe extends through the opening portion to an outside of the housing.

A module according to one embodiment of the present invention includes a substrate; a cooling unit that cools a heat-generating component provided on the substrate; a connection terminal portion provided on the substrate; and a connection pipe that is connected to the cooling unit through an opening provided in a direction different from a direction of at least one of insertion and withdrawal of the connection terminal, wherein the connection pipe is provided at a position not interfering with the opening when the connection terminal portion is being inserted or withdrawn.

Advantageous Effects of Invention

According to the module and the server in the present invention, in the module, which is provided with a connection pipe extending in a direction different from the insertion/withdrawal direction of a connection terminal portion, a substrate can be easily inserted and withdrawn.

DESCRIPTION OF EMBODIMENTS

Multiple embodiments of the present invention will be explained below with reference to the drawings. However, regarding the present embodiments, the portions that are identical to the aforementioned conventional examples will be referred to by using the same names, and their explanations will be omitted.

First Embodiment

Figure 1:
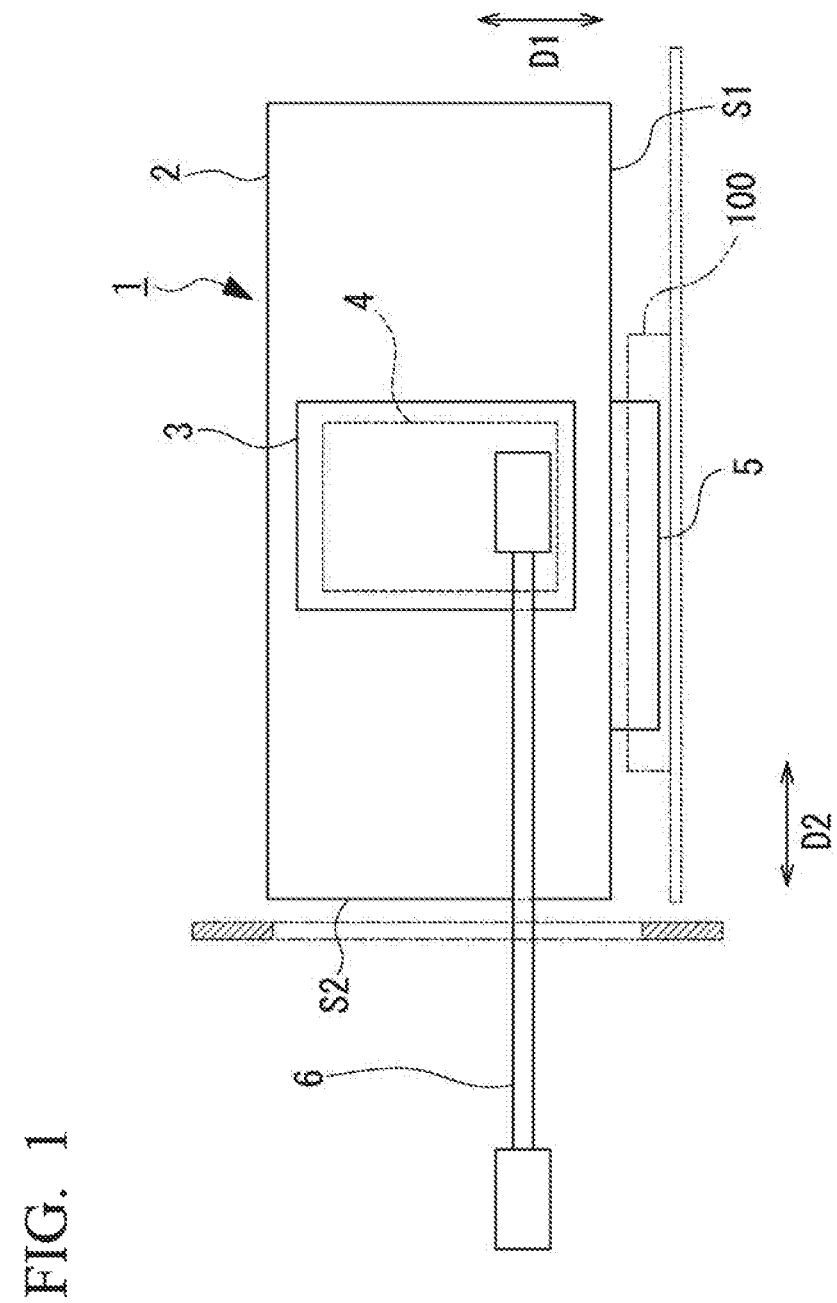
FIG. 1 is a diagram illustrating the minimum structure of a module according to a first embodiment.

FIG. 1 is a diagram illustrating the minimum structure of a module according to the first embodiment.

As illustrated in this drawing, it is sufficient for the module 1 to comprise at least a substrate 2, a cooling unit 3, a connection terminal portion 5 and a connection pipe 6.

A heat-generating component 4 is provided on the substrate 2. The cooling unit 3 cools the heat-generating component 4 provided on the substrate 2.

The connection terminal portion 5 is provided on the substrate 2. The connection terminal portion 5 is inserted and withdrawn with respect to an external connector 100 or the like. When inserting or withdrawing the connection terminal portion 5 with respect to the connector 100 or the like, the connection terminal portion 5 is inserted or withdrawn in the insertion/withdrawal direction D1, which intersects an edge S1 of the substrate 2 on which the connection terminal portion 5 is provided.

The connection pipe 6 is connected to the cooling unit 3. The connection pipe 6 extends in the direction D2, which is different from the insertion/withdrawal direction D1 of the connection terminal portion 5. On an edge S2 of the substrate 2 from which the connection pipe 6 extends, the connection pipe 6 extends from the side towards the connection terminal portion 5. For example, the connection pipe 6 extends from a portion of the edge S2 near the edge S1 on which the connection terminal portion 5 is provided.

With this module 1, when inserting or withdrawing the connection terminal portion 5 with respect to the external connector 100 or the like, the substrate 2 is inserted or withdrawn in the insertion/withdrawal direction D1 intersecting the edge S1 of the substrate 2 on which the connection terminal portion 5 is provided. For example, when withdrawing the connection terminal portion 5 from the connector 100, the substrate 2 is displaced in a direction away from the connection terminal portion 5 in the insertion/withdrawal direction D1 intersecting the edge S1 on which the connection terminal portion 5 is provided. When connecting the connection terminal portion 5 to the connector 100, the substrate 2 is displaced towards the connection terminal portion 5 in the insertion/withdrawal direction D1 intersecting the edge S1 on which the connection terminal portion 5 is provided.

As mentioned above, the connection pipe 6 extends from the side towards the connection terminal portion 5. In other words, on the edge S2 from which the connection pipe 6 extends, the connection pipe 6 is not located on the side opposite to the connection terminal portion 5. Therefore, when the substrate 2 is displaced in the insertion/withdrawal direction D1 intersecting the edge S1 on which the connection terminal portion 5 is provided in order to insert or withdraw the connection terminal portion 5 with respect to the connector 100, the connection pipe 6 does not tend to interfere with other components or the like located on the side opposite to the connection terminal portion 5. As a result thereof, the module 1 comprising the connection pipe 6 extending in the direction D2 different from the insertion/withdrawal direction D1 of the connection terminal portion 5 is less susceptible to interfere from other components or the like, and the substrate 2 can be easily inserted or withdrawn.

Modified Example of First Embodiment

Figure 2:
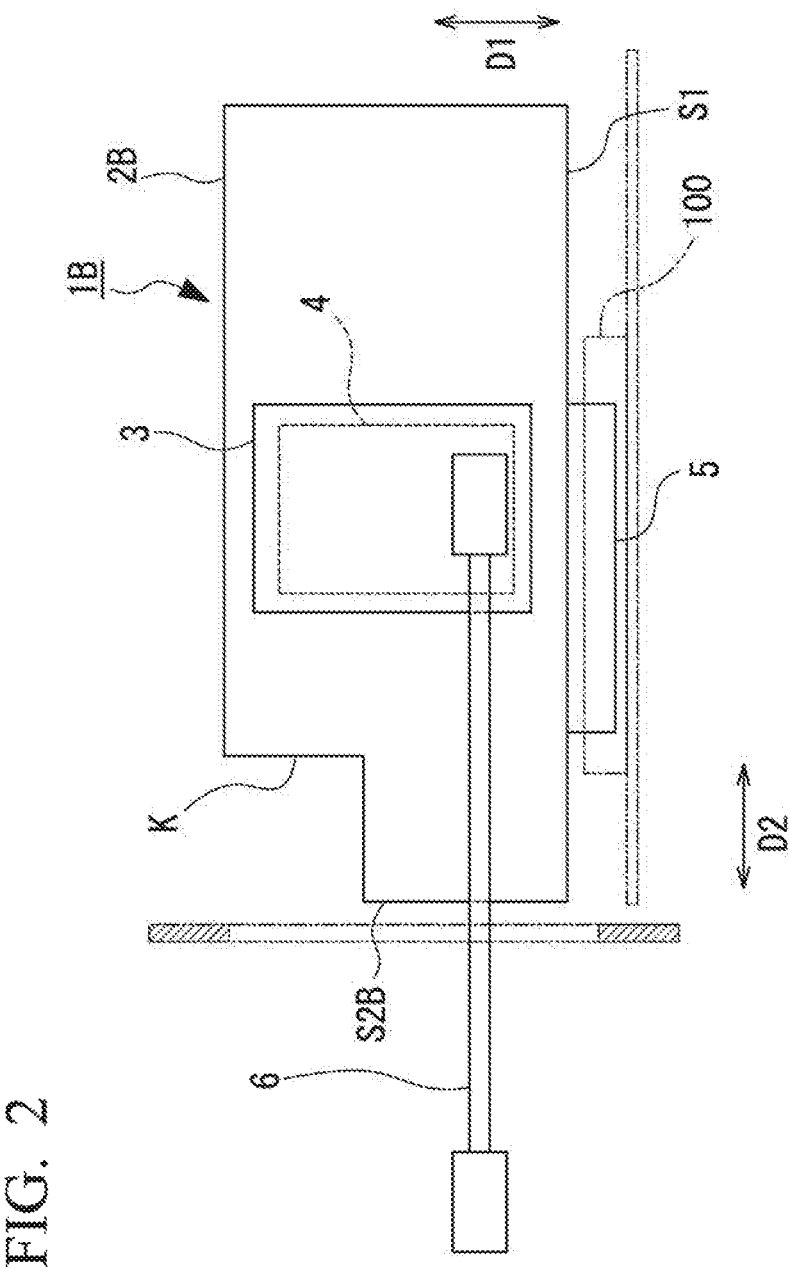
FIG. 2 is a diagram illustrating the minimum structure of a module according to a modified example of the first embodiment.

FIG. 2 is a diagram illustrating the minimum structure of a module according to a modified example of the first embodiment.

In the above-mentioned first embodiment, the substrate 2B was rectangular, but the invention is not limited thereto. For example, the substrate may have a cutout portion.

As illustrated in FIG. 2, on the substrate 2B of the module 1B, a cutout portion K is formed on the edge S2B of the substrate 2B from which the connection pipe 6 extends. The cutout portion K is formed, for example, by recessing a portion of the substrate 2B inward, in stepped fashion, towards the inner side of the substrate 2B.

With the substrate 2B having the cutout portion K, on the edge S2B from which the connection pipe 6 extends, the connection pipe 6 extends from the side towards the connection terminal portion 5.

In this module 1B also, the connection pipe 6 extends from the side towards the connection terminal portion 5. In other words, on the edge S2B from which the connection pipe 6 extends, the connection pipe 6 is not located on the side opposite to the connection terminal portion 5. Therefore, when the substrate 2B is displaced in the insertion/withdrawal direction D1 intersecting the edge S1 on which the connection terminal portion 5 is provided in order to insert or withdraw the connection terminal portion 5 with respect to the connector 100, the connection pipe 6 does not tend to interfere with other components or the like located on the side opposite to the connection terminal portion 5. As a result thereof, the module 1B comprising the connection pipe 6 extending in the direction D2 different from the insertion/withdrawal direction D1 of the connection terminal portion 5 is less susceptible to interfere from components or the like, and the substrate 2B can be easily inserted and withdrawn.

In FIGS. 1 and 2 illustrating the present embodiment and the modified example thereof, the connection terminal portion 5 is provided on an edge on an outer peripheral portion of the substrate 2, but the position of the connection terminal portion 5 is not limited thereto.

Second Embodiment

Figure 3:
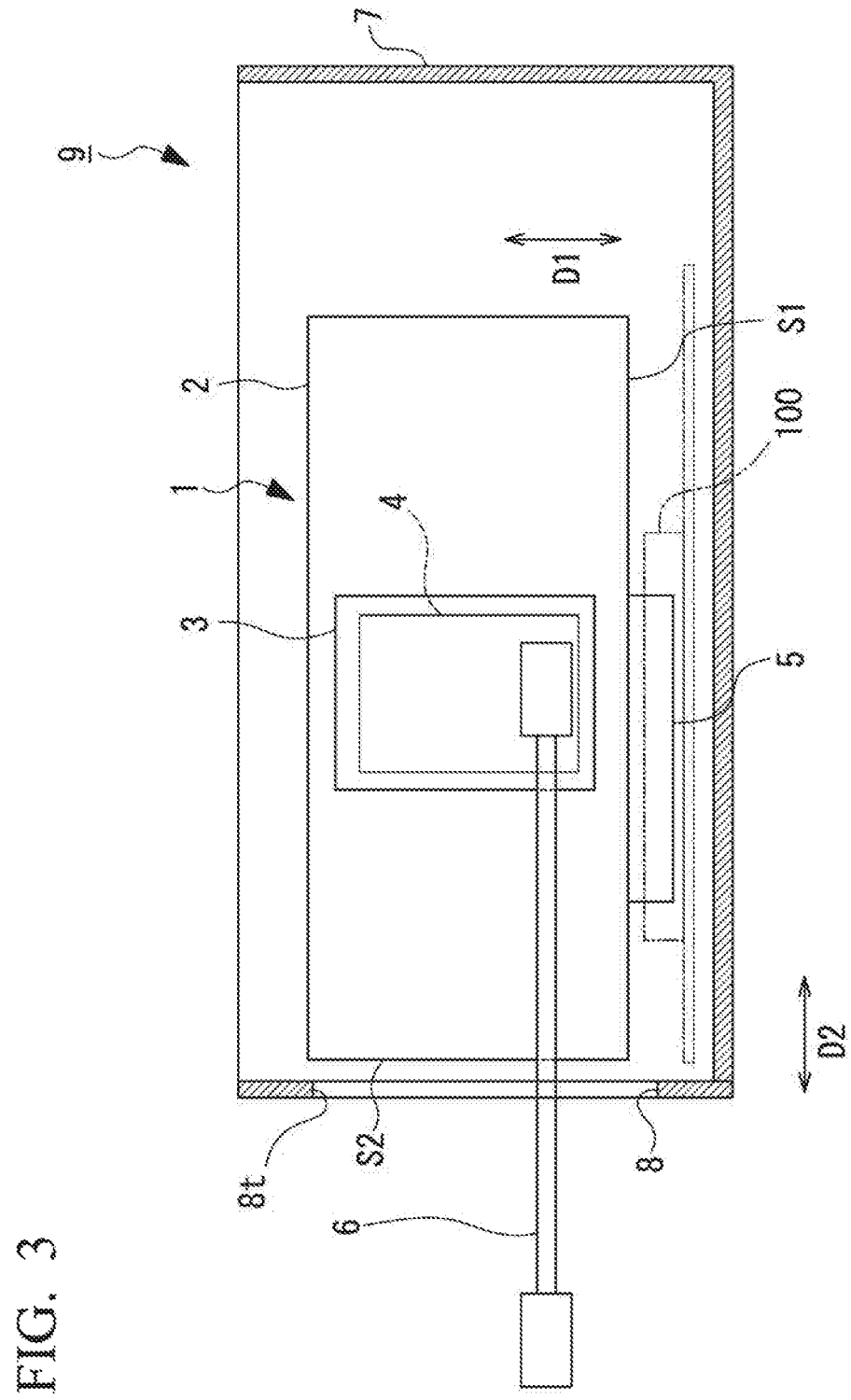
FIG. 3 is a diagram illustrating the minimum structure of a server according to a second embodiment.

FIG. 3 is a diagram illustrating the minimum structure of a server according to the second embodiment.

As illustrated in this drawing, it is sufficient for the server 9 to comprise at least a module 1 and a housing 7.

The module 1 is similar to that indicated for the above-described first embodiment. That is, the module 1 comprises at least a substrate 2, a cooling unit 3, a connection terminal portion 5 and a connection pipe 6.

A heat-generating component 4 is provided on the substrate 2. The cooling unit 3 cools the heat-generating component 4 provided on the substrate 2.

The connection terminal portion 5 is provided on the substrate 2. When inserting or withdrawing the connection terminal portion 5 with respect to a connector 100 or the like, the connection terminal portion 5 is inserted or withdrawn in the insertion/withdrawal direction D1, which intersects the edge S1 of the substrate 2 on which the connection terminal portion 5 is provided.

The connection pipe 6 is connected to the cooling unit 3. The connection pipe 6 extends in the direction D2, which is different from the insertion/withdrawal direction D1 of the connection terminal portion 5. On the edge S2 of the substrate 2 from which the connection pipe 6 extends, the connection pipe 6 extends from the side towards the connection terminal portion 5.

The housing 7 houses the module 1. The housing 7 has an opening portion 8. The opening portion 8 faces the edge S2 of the substrate 2 from which the connection pipe 6 extends.

The connection pipe 6 extends to the outside the housing 7 through the opening portion 8.

In this server 9, when inserting or withdrawing the substrate 2 of the module 1, the connection pipe 6, which extends to the outside of the housing 7 through the opening portion 8, is displaced together with the substrate 2, in the insertion/withdrawal direction of the substrate 2, inside the opening portion 8. On the edge S2 from which the connection pipe 6 extends, the connection pipe 6 is provided on the side towards the connection terminal portion 5, so that even if the substrate 2 is displaced in the insertion/withdrawal direction D1 of the connection terminal portion 5 when inserting or withdrawing the connection terminal portion 5, the connection pipe 6 does not tend to interfere with the inner rim 8t of the opening 8. As a result thereof, with this server 9, it is possible to easily insert or withdraw the module 1 comprising the connection pipe 6 extending in the direction D2 different from the insertion/withdrawal direction D1 of the connection terminal portion 5.

Third Embodiment

Figure 4:
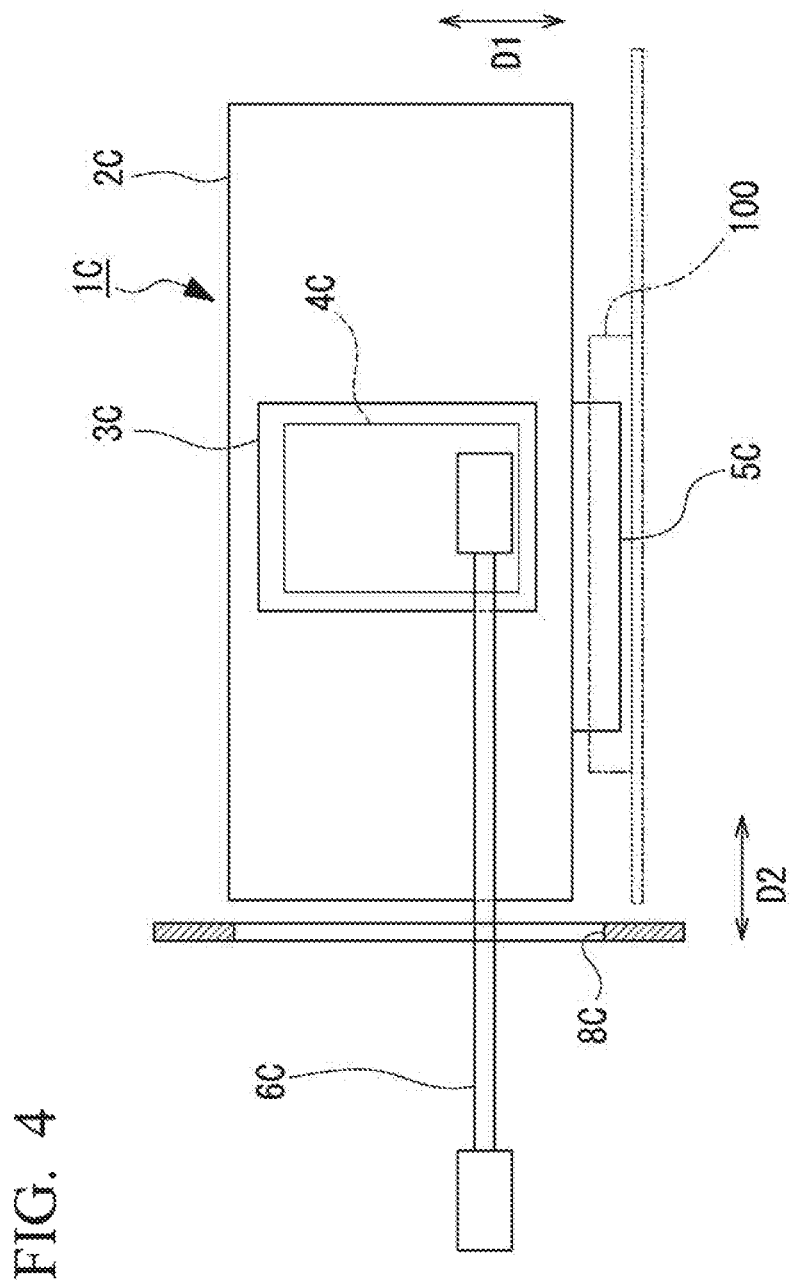
FIG. 4 is a diagram illustrating the minimum structure of a module according to a third embodiment.

FIG. 4 is a diagram illustrating the minimum structure of a module according to the third embodiment.

As illustrated in this drawing, it is sufficient for the module 1C to comprise at least a substrate 2C, a cooling unit 3C, a connection terminal portion 5C and a connection pipe 6C.

The substrate 2C is provided with a heat-generating component 4C. The cooling unit 3C cools the heat-generating component 4C provided on the substrate 2C.

The connection terminal portion 5C is provided on the substrate 2C. The connection terminal portion 5C is inserted and withdrawn with respect to an external connector 100 or the like.

The connection pipe 6C is connected to the cooling unit 3C. The connection pipe 6C is connected to the cooling unit 3C through an opening 8C provided in a direction D2 different from the insertion/withdrawal direction D1 of the connection terminal portion 5C. The connection pipe 6C is provided at a position not interfering with the opening 8C when the connection terminal portion 5C is being inserted or withdrawn.

In this module 1C, the connection pipe 6C is provided at a position not interfering with the opening 8C when the connection terminal portion 5C is being inserted or withdrawn. Therefore, when the substrate 2C is displaced in the insertion/withdrawal direction D1 in order to insert or withdraw the connection terminal portion 5C with respect to the connector 100, the connection pipe 6C does not interfere with the opening 8C. As a result thereof, the module 1C comprising the connection pipe 6C connected to the cooling unit 3C through the opening 8C is less susceptible to interfere from other components and the like, and the substrate 2C can be easily inserted or withdrawn.

Fourth Embodiment

Figure 5:
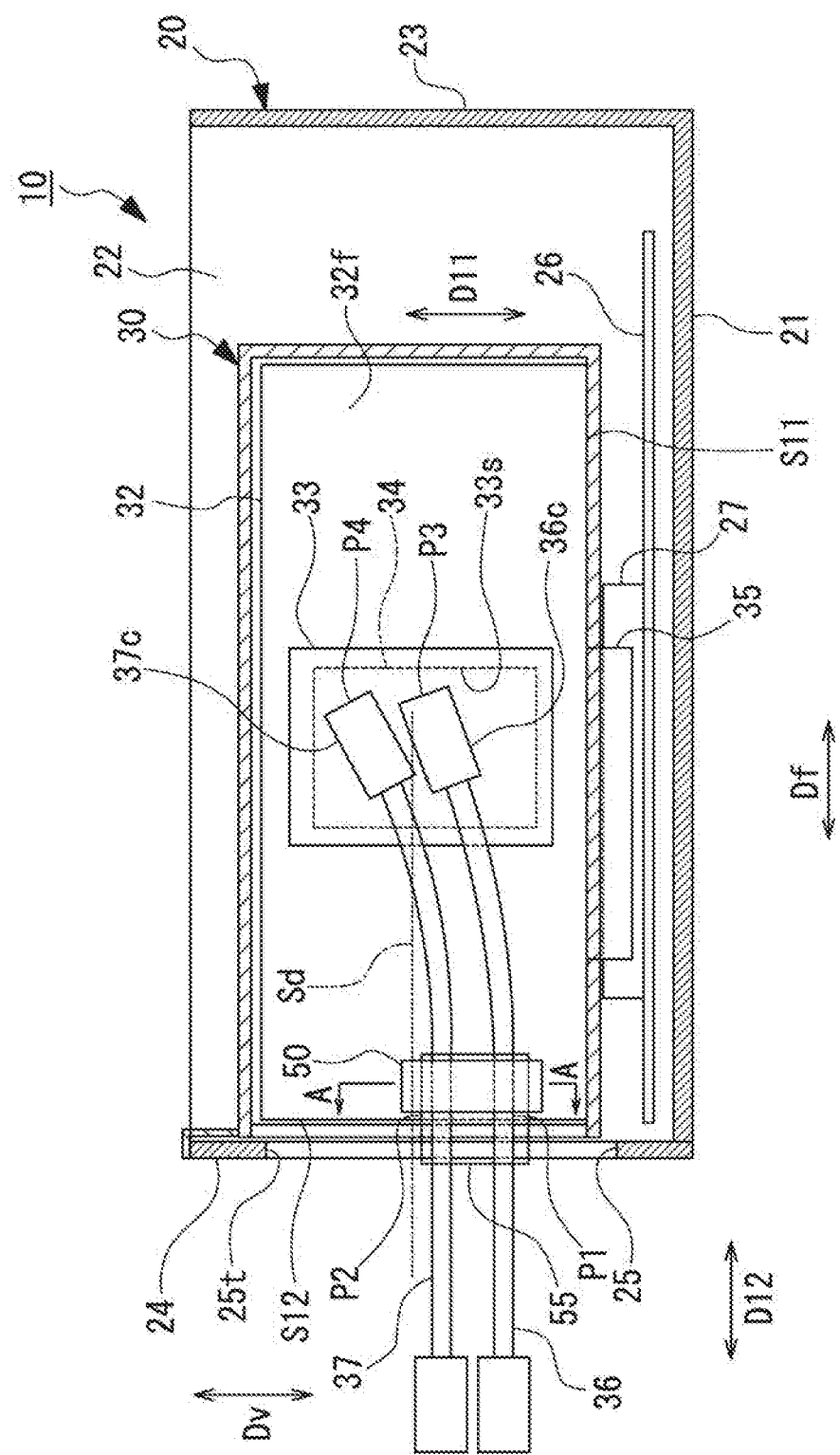
FIG. 5 is a vertical section view illustrating the structure of a server according to a fourth embodiment.
Figure 6:
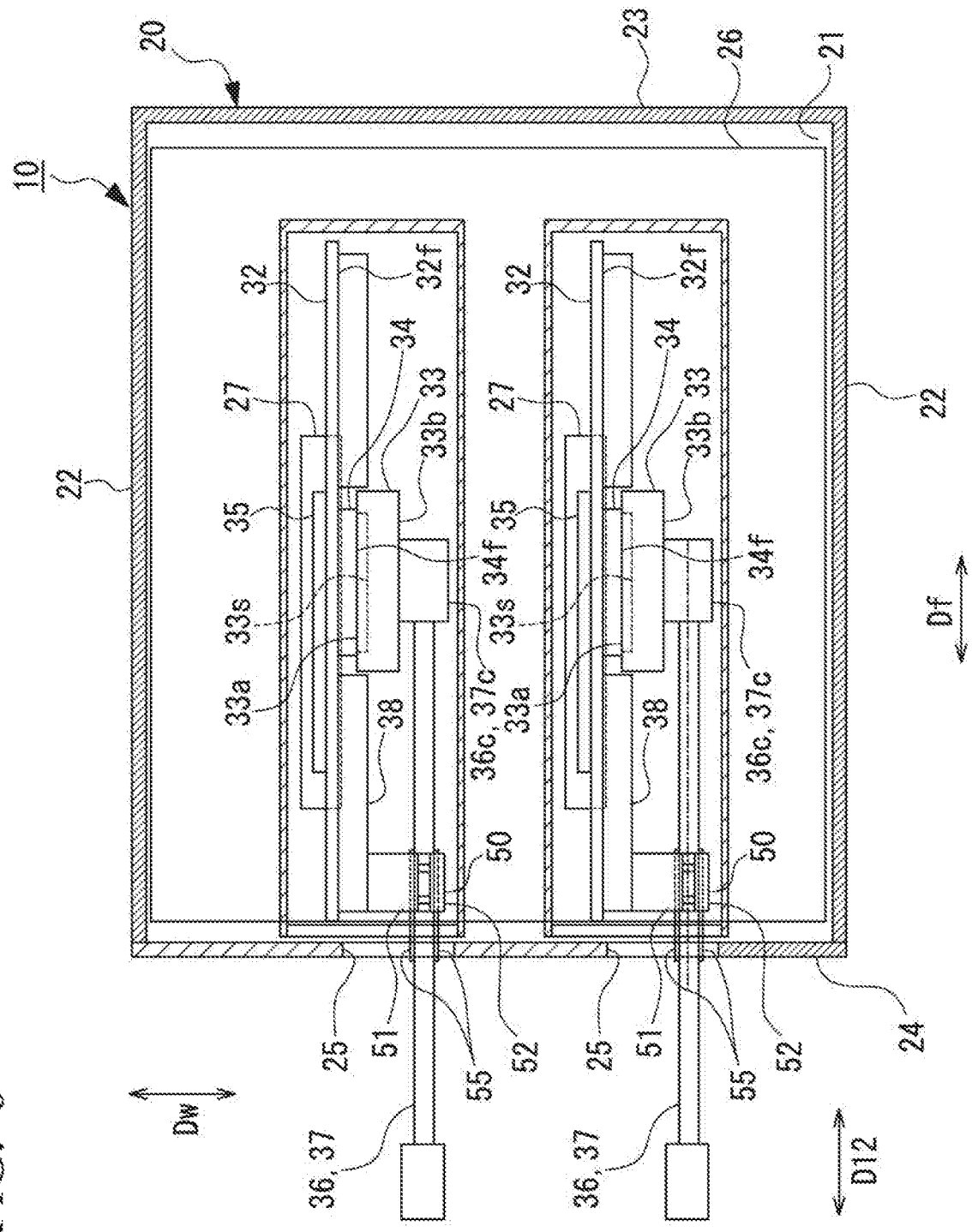
FIG. 6 is a horizontal section view illustrating the structure of a server according to the fourth embodiment.

FIG. 5 is a vertical section view illustrating the structure of a server according to the fourth embodiment. FIG. 6 is a horizontal section view illustrating the structure of the server according to the fourth embodiment.

As illustrated in FIG. 5 and FIG. 6, the server 10 of the present embodiment comprises a housing 20 and a module 30.

The housing 20 is in the shape of a hollow box and is contained in a server rack, which is not illustrated. The housing 20 is supported so as to be able to slide in a horizontal direction (hereinafter referred to as the front-rear direction Df) connecting one end of the server rack (not illustrated) with the other end. The housing 20 contains, in the interior thereof, a base substrate 26, a module 30, a power supply device (not illustrated) and the like.

The housing 20 comprises a bottom plate 21, side plates 22, a front plate 23 and a rear plate 24.

The bottom plate 21, in plan view, is rectangular, having long edges in the front-rear direction Df and having short edges in the width direction Dw orthogonal to the front-rear direction Df. The side plates 22 are located on both sides, in the width direction Dw, of the bottom plate 21. The side plates 22 respectively extend upward, in the vertical direction Dv, from both sides, in the width direction Dw, of the bottom plate 21. The front plate 23 is located on one end, in the front-rear direction Df, of the bottom plate 21. The front plate 23 extends upward from the front end of the bottom plate 21. The rear plate 24 is located on the other end, in the front-rear direction Df, of the bottom plate 21. The rear plate 24 extends upward from the rear end of the bottom plate 21.

The rear plate 24 has opening portions 25 penetrating therethrough in the front-rear direction Df. A plurality of the opening portions 25 are provided so as to be spaced apart in the width direction Dw.

The base substrate 26 is plate-shaped and is provided along the bottom plate 21 of the housing 20. The base substrate 26 has a connector 27 on the upper surface thereof. A connection terminal portion 35 of the module 30 to be mentioned below is connected to the connector 27.

The module 30 comprises a substrate 32, a cooling unit 33, a supply connection pipe (connection pipe) 36, a discharge connection pipe (connection pipe) 37 and a fixation portion 50.

The substrate 32 is in the shape of a rectangular plate having short edges (pipe-extending edge) S12 and long edges S11. The substrate 32 is arranged so that the long edges S11 are aligned with the front-rear direction Df and the short edges S12 are aligned with the vertical direction Dv, in the state in which the module 30 is contained inside the housing 20.

The substrate 32 has a connection terminal portion 35. The connection terminal portion 35 is provided on one of the long edges S11 on the substrate 32. The connection terminal portion 35 is provided on the long edge S11 located on the lower side, in the vertical direction Dv, in the state in which the module 30 is contained inside the housing 20. The connection terminal portion 35 is inserted and withdrawn with respect to the connector 27 on the base substrate 26 inside the housing 20. The insertion/withdrawal direction D11 of the connection terminal portion 35 with respect to the connector 27 is a direction orthogonal to the upper surface of the base substrate 26, i.e., the vertical direction Dv.

The substrate 32 has a heat-generating component 34 such as a CPU (Central Processing Unit). The heat-generating component 34 is mounted on one surface 32f of the substrate 32.

The cooling unit 33 is provided on the substrate 32. The cooling unit 33 is provided so as to be stacked on the heat-generating component 34. More specifically, the cooling unit 33 should preferably have a structure such that, when stacked on the substrate 32, there is contact over as large an area as possible and there is tight contact with as large a contact force as possible, so that heat is transferred with the lowest possible contact resistance. The cooling unit 33 cools the heat-generating component 34. The cooling unit 33 has a rectangular shape that is larger than the heat-generating component 34 when viewed from a direction orthogonal to the one surface 32f of the substrate 32. The cooling unit 33 has a prescribed thickness in the direction orthogonal to the one surface 32f of the substrate 32. The cooling unit 33 has a recess 33s in a first surface 33a facing the heat-generating component 34. The recess 33s is recessed from the first surface 33a towards a second surface 33b on the side opposite thereto. The recess 33s covers at least a portion of the surface 34f of the heat-generating component 34.

The supply connection pipe 36 and the discharge connection pipe 37 are connected to the cooling unit 33.

The supply connection pipe 36 supplies a coolant to the cooling unit 33. The supply connection pipe 36 has, for example, an elbow-shaped connection portion 36c on one end. The connection portion 36c on the supply connection pipe 36 is connected to the cooling unit 33. The connection portion 36c is arranged to be on one side, relative to the center of the heat-generating component 34, in the recess 33s in the cooling unit 33. The connection portion 36c is arranged to be, for example, on the lower side, in the vertical direction Dv, relative to the center of the heat-generating component 34, in the state in which the module 30 is contained inside the housing 20.

The supply connection pipe 36 extends to the outside of the substrate 32. The supply connection pipe 36 extends from the substrate 32 in the direction D12, which is different from the insertion/withdrawal direction D11 of the connection terminal portion 35. The supply connection pipe 36 extends to the outside of the substrate 32 from a short edge S12 of the substrate 32, which is different from the long edge S11 on which the connection terminal portion 35 is provided. The supply connection pipe 36 is connected to a supply pipe (not illustrated). The supply pipe (not illustrated) supplies the supply connection pipe 36 with a coolant supplied from coolant supply equipment (not illustrated).

The discharge connection pipe 37 discharges the coolant from the cooling unit 33. The discharge connection pipe 37 is provided alongside the supply connection pipe 36 in a direction along the one surface 32f of the substrate 32.

The discharge connection pipe 37 has a connection portion 37c on one end. The connection portion 37c on the discharge connection pipe 37 is connected to the cooling unit 33. The connection portion 37c is arranged to be on the other side, relative to the center of the heat-generating component 34, in the recess 33s in the cooling unit 33. The connection portion 37c is arranged to be, for example, on the upper side, in the vertical direction Dv, relative to the center of the heat-generating component 34, in the state in which the module 30 is contained inside the housing 20.

The discharge connection pipe 37 extends to the outside of the substrate 32. The discharge connection pipe 37 extends from the substrate 32 in the direction D12, which is different from the insertion/withdrawal direction D11 of the connection terminal 35. The discharge connection pipe 37 extends to the outside of the substrate 32 from a short edge S12 of the substrate 32, which is different from the long edge S11 on which the connection terminal portion 35 is provided. The discharge connection pipe 37 is connected to a discharge pipe (not illustrated) that discharges the coolant to the outside.

The supply connection pipe 36 and the discharge connection pipe 37 extend from extension positions P1 and P2 that are located, on the short edge S12 of the substrate 32 from which the supply connection pipe 36 and the discharge connection pipe 37 extend, on the side towards the connection terminal portion 35 relative to the center Sd of the short edge S12. For example, the supply connection pipe 36 and the discharge connection pipe 37 extend from extension positions P1 and P2, on the short edge S12, which are closer to the long edge S11 on which the connection terminal portion 35 is provided than the center Sd is.

The supply connection pipe 36 and the discharge connection pipe 37 are connected to the cooling unit 33 at connection positions P3 and P4 that are shifted towards the side opposite (the upper side in FIG. 5) to the side (the side towards the base substrate 26, the lower side in FIG. 5) on which the connection terminal portion 35 is provided, relative to the extension positions P1 and P2 from which the supply connection pipe 36 and the discharge connection pipe 37 extend from the pipe-extending short edge S12.

From the connection positions P3 and P4 to the extension positions P1 and P2, the supply connection pipe 36 and the discharge connection pipe 37 are curved towards the side on which the connection terminal portion 35 is provided. Furthermore, the supply connection pipe 36 and the discharge connection pipe 37 extend from the cooling unit 33 in mutually different directions. For example, the supply connection pipe 36 and the discharge connection pipe 37 extend with different orientations. Specifically, the connection portion 36c of the supply connection pipe 36 and the connection portion 37c of the discharge connection pipe 37 are not parallel to each other when viewed from a direction orthogonal to the one surface 32f of the substrate 32. The connection portion 36c of the supply connection pipe 36 and the connection portion 37c of the discharge connection pipe 37 are both inclined relative to the direction parallel to the long edges S11 of the substrate 32. The inclination angle of the connection portion 37c of the discharge connection pipe 37 relative to the direction parallel to the long edges S11 is greater than the inclination angle of the connection portion 36c of the supply connection pipe 36.

The fixation portion 50 fixes the supply connection pipe 36 and the discharge connection pipe 37. The fixation portion 50 is provided at a position at which stress from the supply connection pipe 36 and the discharge connection pipe 37 to the cooling unit 33 is reduced. Specifically, the fixation portion 50 fixes the supply connection pipe 36 and the discharge connection pipe 37 at positions distanced from the connection portions 36c and 37c connected to the cooling unit 33. The fixation portion 50 constrains the movement of the supply connection pipe 36 and the discharge connection pipe 37 in the pipe axial directions. The fixation portion 50 fixes the supply connection pipe 36 and the discharge connection pipe 37 on the short edge S12 of the substrate 32 from which the supply connection pipe 36 and the discharge connection pipe 37 extend.

Figure 7:
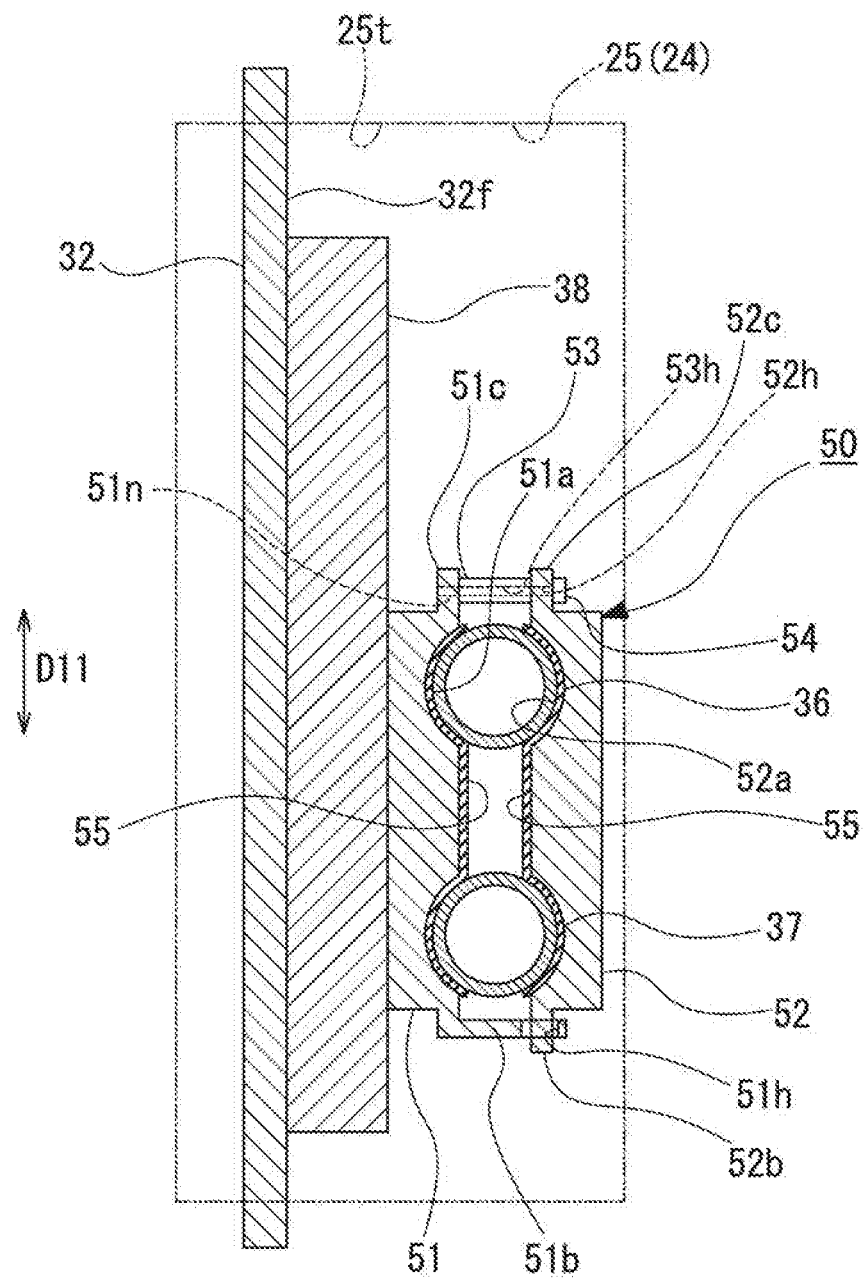
FIG. 7 is a section view illustrating the structure of a fixation portion according to the fourth embodiment.

FIG. 7 is a section view illustrating the structure of the fixation portion in the fourth embodiment.

As illustrated in FIG. 6 and FIG. 7, the fixation portion 50 is attached to a reinforcement member 38. The reinforcement member 38 is arranged parallel to the substrate 32. The reinforcement member 38 is provided on the one surface 32f of the substrate 32 at a portion where the cooling unit 33 is not provided. The reinforcement member 38 comprises, for example, an aluminum alloy or the like. The reinforcement member 38 has the function of reinforcing the substrate 32 and the function of receiving heat transferred from various types of electronic components mounted on the one surface 32f of the substrate 32 and dissipating the heat.

As illustrated in FIG. 7, the fixation portion 50 has a base member 51, a clamp member 52 and a spacer 53.

The base member 51 is fixed to the reinforcement member 38. The base member 51 may be formed integrally with the reinforcement member 38. The base member 51 has a receiving recess 51a, an engagement portion 51b and a pedestal portion 51c. The receiving recess 51a accommodates portions, in the radial direction, of the supply connection pipe 36 and the discharge connection pipe 37. The engagement portion 51b is provided on one side of the receiving recess 51a and extends away from the reinforcement member 38 and towards the clamp member 52. The engagement portion 51b has an engagement hole 51h for engaging with the clamp member 52. The pedestal portion 51c is provided on the other side of the receiving recess 51a. The pedestal portion 51c is located on the side opposite to the engagement portion 51b with the receiving recess 51a therebetween. The pedestal portion 51c has a female screw hole 51n.

The clamp member 52 faces the base member 51 on the side away from the reinforcement member 38. The clamp member 52 has a receiving recess 52a, an engagement claw 52b and a flange portion 52c. The receiving recess 52a accommodates portions, in the radial direction, of the supply connection pipe 36 and the discharge connection pipe 37.

The engagement claw 52b is provided on one side of the receiving recess 52a. The engagement claw 52b engages with the engagement hole 51h on the engagement portion 51b of the base member 51. The flange portion 52c is provided on the other side of the receiving recess 52a. The flange portion 52c is located on the side opposite to the engagement claw 52b with the receiving recess 52a therebetween. The flange portion 52c has a screw penetration hole 52h.

The spacer 53 is arranged between the pedestal portion 51c of the base member 51 and the flange portion 52c of the clamp member 52. The spacer 53 is tubular and has a through hole 53h.

With this fixation portion 50, the supply connection pipe 36 and the discharge connection pipe 37 are sandwiched between the receiving recess 51a in the base member 51 and the receiving recess 52a in the clamp member 52. The clamp member 52 is restricted from moving in the direction away from the reinforcement member 38 on one side of the receiving recess 52a by the engagement claw 52b being engaged with the engagement hole 51h. Additionally, the clamp member 52 is fastened to the base member 51 by a screw 54 on the other side of the receiving recess 52a. The screw 54 is passed through the screw penetration hole 52h in the flange portion 52c of the clamp member 52 and the through hole 53h in the spacer 53, and is screwed into the female screw hole 51n in the pedestal portion 51c of the base member 51. The spacing between the flange portion 52c of the clamp member 52 and the pedestal portion 51c of the base member 51 is regulated by the spacer 53. As a result thereof, the supply connection pipe 36 and the discharge connection pipe 37 sandwiched between the receiving recess 51a of the base member 51 and the receiving recess 52a of the clamp member 52 can be kept from being excessively crushed in the radial direction.

As illustrated in FIG. 6, the supply connection pipe 36 and the discharge connection pipe 37 fixed by the fixation portion 50 are spaced (the spacing from the substrate 32 in a direction orthogonal to the one surface 32f of the substrate 32) from the substrate 32 by the same distance at the parts connected to the cooling unit 33 and at the parts fixed to the fixation portion 50.

Additionally, as illustrated in FIG. 5, the supply connection pipe 36 and the discharge connection pipe 37 are curved between the parts fixed to the fixation portion 50 and the connection portions 36c and 37c, which are the parts connected to the cooling unit 33.

As illustrated in FIG. 7, elastic sheets 55 are sandwiched between the base member 51 and the clamp member 52 of the fixation portion 50, and the supply connection pipe 36 and the discharge connection pipe 37. The elastic sheets 55 comprise a rubber-based material or the like, and have elasticity. Due to the elastic sheets 55, a compressive force in the radial direction is applied to the supply connection pipe 36 and the discharge connection pipe 37 sandwiched by the receiving recess 51a in the base member 51 and the receiving recess 52a in the clamp member 52. The elastic sheets 55 are elastically deformed in the thickness directions thereof, thereby reducing the compressive force in the radial direction applied to the supply connection pipe 36 and the discharge connection pipe 37.

Additionally, the elastic sheets 55, due to the friction with the supply connection pipe 36 and the discharge connection pipe 37, keep the supply connection pipe 36 and the discharge connection pipe 37 from shifting in the pipe axial direction. Furthermore, the elastic sheets 55 are provided, in a state of compression in the thickness directions thereof, between the base member 51 and the clamp member 52 of the fixation portion 50, and the supply connection pipe 36 and the discharge connection pipe 37, thereby increasing the friction generated with respect to the supply connection pipe 36 and the discharge connection pipe 37. As a result thereof, the shifting of the supply connection pipe 36 and the discharge connection pipe 37 in the pipe axial direction can be more reliably suppressed.

As illustrated in FIG. 5 and FIG. 6, the supply connection pipe 36 and the discharge connection pipe 37 extend to the outside of the housing 20 through an opening portion 25 formed in the rear plate 24 of the housing 20, in a state in which the module 30 is contained inside the housing 20.

The elastic sheets 55 extend from the fixation portion 50 to the inside of the opening portion 25. The elastic sheets 55 are located between the inner rim of the opening portion 25, and the supply connection pipe 36 and the discharge connection pipe 37. As a result thereof, the supply connection pipe 36 and the discharge connection pipe 37 are kept from scraping against the inner rim of the opening portion 25.

The module 30 as described above can be attached to or detached from the housing 20. When attaching or detaching the module 30 with respect to the housing 20, the connection terminal portion 35 is inserted or withdrawn with respect to the connector 27 in the base substrate 26 in the housing 20. When inserting or withdrawing the connection terminal portion 35 with respect to the connector 27, the substrate 32 is inserted or withdrawn in the insertion/withdrawal direction D11, which intersects the long edge S11 of the substrate 32 on which the connection terminal portion 35 is provided.

When withdrawing the connection terminal portion 35 from the connector 27, the substrate 32 is displaced in the direction away from the connection terminal portion 35 in the insertion/withdrawal direction D11 intersecting the long edge S11 on which the connection terminal portion 35 is provided. When displacing the substrate 32 in the insertion/withdrawal direction D11 in this way, the supply connection pipe 36 and the discharge connection pipe 37 extend from a side of the short edge S12 towards the connection terminal portion 35 relative to the center Sd. For this reason, there is no tendency to interfere with other components such as, for example, the inner rim 25t of the opening portion 25, located on the side opposite to the connection terminal portion 35.

In this module 30, the supply connection pipe 36 and the discharge connection pipe 37 extend from the side towards the connection terminal portion 35. As a result thereof, when inserting or withdrawing the connection terminal portion 35 with respect to the connector 27, the supply connection pipe 36 and the discharge connection pipe 37 do not tend to interfere with the inner rim 25t of the opening portion 25 located on the side opposite to the connection terminal portion 35. Therefore, in a module 30 comprising a supply connection pipe 36 and a discharge connection pipe 37 extending in a direction D12 different from the insertion/withdrawal direction D11 of the connection terminal portion 35, the substrate 32 can be easily inserted and withdrawn.

In this module 30, on the short edge S12 of the substrate 32 from which the supply connection pipe 36 and the discharge connection pipe 37 extend, the supply connection pipe 36 and the discharge connection pipe 37 extend from a side towards the connection terminal portion 35 relative to the center Sd of the short edge S12. As a result thereof, when inserting or withdrawing the connection terminal portion 35 with respect to the connector 27, the supply connection pipe 36 and the discharge connection pipe 37 do not tend to interfere with the inner rim 25t of the opening portion 25 located on the side opposite to the connection terminal portion 35. Therefore, in the module 30 comprising the supply connection pipe 36 and the discharge connection pipe 37 extending in a direction D12 different from the insertion/withdrawal direction D11 of the connection terminal portion 35, the substrate 32 can be easily inserted and withdrawn.

In this module 30, the supply connection pipe 36 and the discharge connection pipe 37 are connected to the cooling unit 33 at connection positions P3 and P4 that are shifted towards the side opposite to the side on which the connection terminal portion 35 is provided, relative to the extension positions P1 and P2 from which the supply connection pipe 36 and the discharge connection pipe 37 extend from the pipe-extending short edge S12. As a result thereof, the supply connection pipe 36 and the discharge connection pipe 37 are arranged to extend, from the connection portions 36c and 37c connected to the cooling unit 33, towards the connection terminal portion 35.

As a result thereof, regardless of the position of the cooling unit 33 on the substrate 32, the supply connection pipe 36 and the discharge connection pipe 37 can be extended from the connection terminal portion 35 to the outside of the substrate 32.

In this module 30, the supply connection pipe 36 and the discharge connection pipe 37 extend from the cooling unit 33 in mutually different directions. For example, the supply connection pipe 36 and the discharge connection pipe 37 extend with mutually different orientations. At the connection positions P3 and P4, if the supply connection pipe 36 and the discharge connection pipe 37 were extended in the same direction and made parallel, then the curvature of one of the supply connection pipe 36 and the discharge connection pipe 37 could become smaller in some cases. If the curvature became smaller, then a load would be applied to one of the supply connection pipe 36 and the discharge connection pipe 37, and the flow channel in the pipe could be crushed in some cases.

In contrast therewith, by extending the supply connection pipe 36 and the discharge connection pipe 37 from the cooling unit 33 in different directions, the curvature can be kept from becoming smaller in both the supply connection pipe 36 and the discharge connection pipe 37. Therefore, the load generated on both the supply connection pipe 36 and the discharge connection pipe 37 can be suppressed, thereby keeping the flow channels in the pipes from being crushed. As a result thereof, the flow resistance of the coolant in the supply connection pipe 36 and the discharge connection pipe 37 can be kept from increasing, and high cooling efficiency can be obtained.

In this module 30, the supply connection pipe 36 and the discharge connection pipe 37 are fixed by the fixation portion 50. As a result thereof, even if the supply connection pipe 36 and the discharge connection pipe 37 move outside the module 30, the movement of the supply connection pipe 36 and the discharge connection pipe 37 is not easily transmitted past the fixation portion 50 towards the cooling unit 33. Therefore, stress applied from the supply connection pipe 36 and the discharge connection pipe 37 to the cooling unit 33 can be reduced. As a result thereof, it is possible to keep too much force from being applied to the cooling unit 33, or to the connection portions for connecting the supply connection pipe 36 and the discharge connection pipe 37 to the cooling unit 33, thereby preventing leakage of the coolant and the like.

In this server 10, the supply connection pipe 36 and the discharge connection pipe 37 extend through the opening portions 25 to the outside of the housing 20. When inserting or withdrawing the substrate 32 of the module 30 with respect to the connector 27, the supply connection pipe 36 and the discharge connection pipe 37 are displaced, together with the substrate 32, in the insertion/withdrawal direction D11 of the substrate 32, inside the opening portion 25. The supply connection pipe 36 and the discharge connection pipe 37 are provided on the short edge S12 on the side towards the connection terminal portion 35, and thus do not tend to interfere with the inner rim 25t of the opening portion 25. Therefore, the substrate 32 can be easily inserted and withdrawn.

Additionally, in the above-described embodiment, it is described that the fixation portion 50 constrains the supply connection pipe 36 and the discharge connection pipe 37 in the pipe axial direction, but it is not always essential for the supply connection pipe 36 and the discharge connection pipe 37 to be constrained in the pipe axial direction. In other words, it is sufficient for the fixation portion 50 to reduce the stress transmitted from the supply connection pipe 36 and the discharge connection pipe 37 to the cooling unit 33.

Additionally, it is described that the cooling unit 33 cools only the heat-generating component 34, but other electronic components provided on the substrate 32 may also be cooled. Additionally, the heat transfer between the heat-generating component and the cooling unit is not limited to being made through direct contact, and may be mediated by an electrically insulating thin-film (mica) or a fluid such as grease, or mediated by an intermediary member formed from a material having good thermal conductivity.

Aside from the above, it is possible to select whether or not to adopt features described in the above-mentioned embodiments, or to make appropriate changes to other features, as long as they do not depart from the spirit of the present invention.

Priority is claimed on Japanese Patent Application No. 2017-203289, filed Oct. 20, 2017, the entire disclosure of which is incorporated herein by reference.

INDUSTRIAL APPLICABILITY

According to the module and the server in the present invention, in the module, which is provided with a connection pipe extending in a direction different from the insertion/withdrawal direction of a connection terminal portion, a substrate can be easily inserted and withdrawn.

REFERENCE SIGNS LIST 1, 1B, 1C Module
2, 2B, 1C Substrate
3, 3C Cooling unit
4, 4C Heat-generating component
5, 5C Connection terminal portion
6, 6C Connection pipe
7 Housing
8 Opening portion
8C Opening
9 Server
10 Server
20 Housing
25 Opening portion
30 Module
32 Substrate
33 Cooling unit
34 Heat-generating component
35 Connection terminal portion
36 Supply connection pipe (connection pipe)
37 Discharge connection pipe (connection pipe)
50 Fixation portion
D1, D11 Insertion/withdrawal direction
D2, D12 Different direction
S12 Short edge (pipe-extending edge)
S2, S2B Pipe-extending edge
Sd Center

The invention claimed is:

1. A module comprising:
  a substrate;
  a cooling unit that cools a heat-generating component provided on the substrate;
  a connection terminal portion provided on a first edge of the substrate, the connection terminal portion being capable of inserting and withdrawing with respect to a connector of an external equipment in a first direction orthogonal to the edge; and
  a connection pipe that is connected to the cooling unit and that extends in a second direction different from the first direction,
  wherein the connection pipe extends from a side towards the connection terminal portion; and
  on a second edge of the substrate from which the connection pipe extends, the connection pipe extends from the side towards the connection terminal portion relative to a center of the second edge.

2. The module according to claim 1, wherein the connection pipe is connected to the cooling unit at a position that is shifted towards a side opposite to the side on which the connection terminal portion is provided, relative to a position at which the connection pipe extends from the second edge.

3. The module according to claim 1, wherein:
  the connection pipe includes a supply connection pipe that supplies a cooling medium to the cooling unit, and a discharge connection pipe that discharges the cooling medium from the cooling unit; and the supply connection pipe and the discharge connection pipe that are connected to the cooling unit extend from the cooling unit in different directions.

4. The module according to claim 1, further comprising:
  a fixation portion provided at a position for reducing stress from the connection pipe to the cooling unit.

5. A server comprising:
  a module; and
  a housing containing the module, wherein
  the module comprises:
    a substrate;
    a cooling unit that cools a heat-generating component provided on the substrate;
    a connection terminal portion provided on a first edge of the substrate, the connection terminal portion being capable of inserting and withdrawing with respect to a connector of an external equipment in a first direction orthogonal to the edge; and
    a connection pipe that is connected to the cooling unit and that extends in a second direction different from the first direction,
    wherein the connection pipe extends from a side towards the connection terminal portion,
  on a second edge of the substrate from which the connection pipe extends, the connection pipe extends from the side towards the connection terminal portion relative to a center of the second edge,
  the housing has an opening portion that faces the edge of the substrate from which the connection pipe extends, and
  the connection pipe extends through the opening portion to an outside of the housing.

6. A module provided in a housing having an opening portion, the module comprising:
  a substrate;
  a cooling unit that cools a heat-generating component provided on the substrate;
  a connection terminal portion provided on the substrate, the connection terminal portion being capable of inserting and withdrawing with respect to a connector of an external equipment in a first direction orthogonal to the edge; and
  a connection pipe that is connected to the cooling unit through the opening portion provided in a direction different from the first direction
  wherein the connection pipe is provided at a position not interfering with the opening when the connection terminal portion is being inserted or withdrawn and
  on a second edge of the substrate from which the connection pipe extends, the connection pipe extends from the side towards the connection terminal portion relative to a center of the second edge.

* * * * *